United States Patent
Nakashima et al.

(10) Patent No.: US 10,096,982 B2
(45) Date of Patent: Oct. 9, 2018

(54) ELECTRICAL CONNECTION BOX

(71) Applicants: Yazaki Corporation, Tokyo (JP); TOYOTA JIDOSHA KABUSHIKI KAISHA, Toyota-shi, Aichi-ken (JP)

(72) Inventors: Akinori Nakashima, Shizuoka (JP); Masahiro Wada, Shizuoka (JP); Takahiko Kamiya, Toyota (JP); Norihisa Miyabe, Miyoshi (JP)

(73) Assignees: YAZAKI CORPORATION, Minato-ku, Tokyo (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/825,744

(22) Filed: Nov. 29, 2017

(65) Prior Publication Data
US 2018/0159306 A1 Jun. 7, 2018

(30) Foreign Application Priority Data
Dec. 2, 2016 (JP) .................................. 2016-235195

(51) Int. Cl.
H02G 3/10 (2006.01)
H05K 5/02 (2006.01)
H02G 3/08 (2006.01)

(52) U.S. Cl.
CPC .............. *H02G 3/10* (2013.01); *H02G 3/081* (2013.01); *H05K 5/0204* (2013.01); *H05K 5/0221* (2013.01)

(58) Field of Classification Search
CPC ........ H02G 3/10; H02G 3/081; H05K 5/0204; H05K 5/0221

USPC ......................................................... 174/481
See application file for complete search history.

(56) References Cited

U.S. PATENT DOCUMENTS

| | | | | |
|---|---|---|---|---|
| 5,276,279 A | * | 1/1994 | Brownlie | H02G 3/10 174/50 |
| 6,768,055 B1 | * | 7/2004 | Gorin | H02G 3/10 174/50 |
| 7,077,281 B2 | * | 7/2006 | Sato | H02G 3/088 220/3.8 |
| 2008/0304211 A1 | | 12/2008 | Shimizu | |

FOREIGN PATENT DOCUMENTS

| | | |
|---|---|---|
| JP | 2006-320133 A | 11/2006 |
| JP | 2008-306839 A | 12/2008 |

* cited by examiner

*Primary Examiner* — Dhirubhai R Patel
(74) *Attorney, Agent, or Firm* — Sughrue Mion, PLLC

(57) ABSTRACT

An electrical connection box includes a housing having a temporary fixing projection. The temporary fixing projection includes a locking portion and a plate spring portion. The locking portion is provided with a locking claw projecting toward an outside in a radial direction. The plate spring portion includes a flat surface. In a temporary fixing state where the temporary fixing projection is inserted into a temporary fixing hole of an attachment panel, a locking surface of the locking claw of the locking portion faces a facing surface in an insertion direction. In the temporary fixing state, the plate spring portion is elastically deformed toward an inside in the radial direction. The flat surface of the plate spring portion is in contact with a contact surface and applies, to the attachment panel, a restoring force toward the outside in the radial direction.

6 Claims, 5 Drawing Sheets

ELECTRICAL CONNECTION BOX

CROSS-REFERENCE TO RELATED APPLICATION(S)

The present application claims priority to and incorporates by reference the entire contents of Japanese Patent Application No. 2016-235195 filed in Japan on Dec. 2, 2016.

BACKGROUND OF THE INVENTION

1. Field of the Invention

The present invention relates to an electrical connection box.

2. Description of the Related Art

Conventionally, electrical connection boxes have been known that are mounted in spaces such as engine rooms in vehicles and collectively house therein various electronic components. An example of the electrical connection boxes is attached and fixed to an attachment panel included in a vehicle body such as a vehicle inner wall forming an engine room.

As an example of fixing the electrical connection box to the attachment panel, an operator temporarily fixes a housing of the electrical connection box to the attachment panel and thereafter firmly fixes the housing to the attachment panel by screws tightening a flange of the housing to the attachment panel. As an example of the temporary fixation, techniques are disclosed in which a temporary fixing projection provided to the housing is inserted into a temporary fixing hole provided to the attachment panel (e.g., refer to Japanese Patent Application Laid-open No. 2006-320133 and Japanese Patent Application Laid-open No. 2008-306839).

In another example of the electrical connection boxes, the temporary fixing projection of the housing is provided with a locking claw. In the electrical connection box including the locking claw provided to the temporary fixing projection, the locking claw is in contact with the attachment panel in an insertion direction in a temporary fixing state where the temporary fixing projection is inserted into the temporary fixing hole, thereby preventing the temporary fixing projection from coming away from the temporary fixing hole and thus holding the temporary fixing state.

When a single locking claw is provided to the temporary fixing projection, the contact of the locking claw with the attachment panel is released due to variation in dimensions of the temporary fixing projection or the temporary fixing hole. As a result, the temporary fixing projection tends to easily come away from the temporary fixing hole in some cases. When a plurality of locking claws are provided to the temporary fixing projection, it is difficult for an operator to release the contact of the locking claws with the attachment panel to pull out the temporary fixing projection from the temporary fixing hole during maintenance of the electrical connection box. As a result, it is difficult to attach the housing to the attachment panel and to detach the housing from the attachment panel in some cases.

SUMMARY OF THE INVENTION

In view of the above, the present invention is made and aims to provide an electrical connection box that is easily attached to a fixation target and detached from the fixation target while a housing of the electrical connection box is held to the fixation target in a temporary fixing state.

In order to achieve the above mentioned object, an electrical connection box according to one aspect of the present invention includes a housing that houses one or more electronic components; a firm fixing portion that firmly fixes the housing to a fixation target; and a temporary fixing projection that is formed in such a manner that the temporary fixing projection projects from a housing outer circumferential surface of the housing, and that temporarily fixes the housing to the fixation target by being inserted into a temporary fixing hole formed on the fixation target, wherein the temporary fixing projection includes: a main body that projects from the housing outer circumferential surface and is formed in a tubular shape; and a locking portion and a plate spring portion that are arranged such that the locking portion and the plate spring portion face each other in a radial direction with the main body interposed between the locking portion and the plate spring portion, the locking portion has a locking claw capable of being in contact with the fixation target in an insertion direction in a temporary fixing state where the temporary fixing projection is inserted into the temporary fixing hole, and the plate spring portion has a flat surface that is formed in such a manner that the flat surface extends toward an outside in the radial direction and in the insertion direction, and is elastically deformed toward an inside in the radial direction by an external force, and the flat surface is in contact with the fixation target in the radial direction in a state where the plate spring portion is elastically deformed in the temporary fixing state.

According to another aspect of the present invention, in the electrical connection box, it is preferable that the plate spring portion is formed such that an end of the plate spring portion in the insertion direction is located lower than an end of the main body in the insertion direction, and the main body has a tilted surface that is formed at least a part from the end of the plate spring portion in the insertion direction to the end of the main body in the insertion direction, and is tilted toward a center of the main body.

According to still another aspect of the present invention, in the electrical connection box, it is preferable that the locking portion and the plate spring portion are arranged in such a manner that the locking portion is disposed on a vertical upper direction side in a vertical direction while the plate spring portion is disposed on a vertical lower direction side in the vertical direction in the temporary fixing state.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes an embodiment of an electrical connection box according to the present invention in detail with reference to the accompanying drawings. The embodiment does not limit the invention. The constituent elements of the following embodiment include elements that the persons skilled in the art can easily assume or that are substantially the same as the elements known by those in the art. Various omissions, substitutions, and changes of the constituent elements of the following embodiment described herein may be made without departing from the spirit of the invention.

Embodiment

Figure 1:
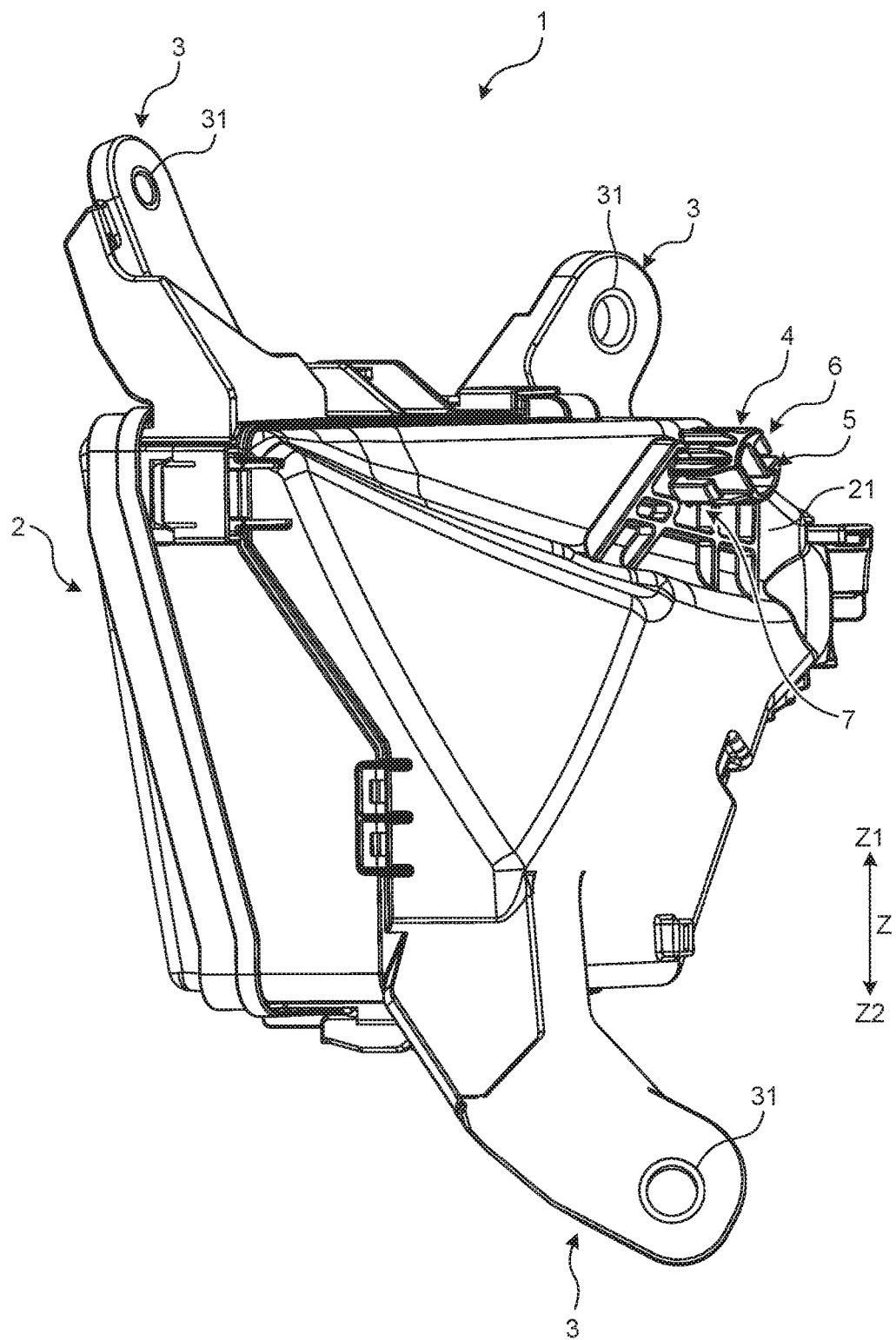
FIG. 1 is a perspective view illustrating an electrical connection box.
Figure 2:
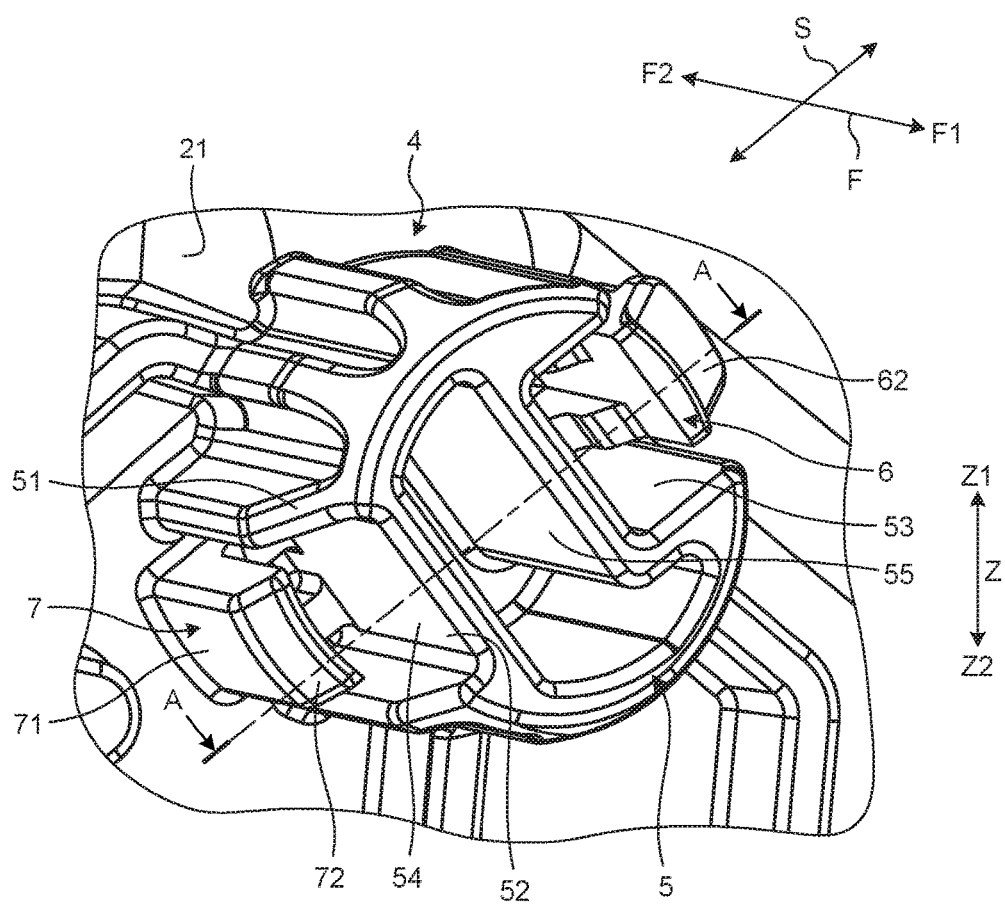
FIG. 2 is a partially enlarged view illustrating the electrical connection box.
Figure 3:
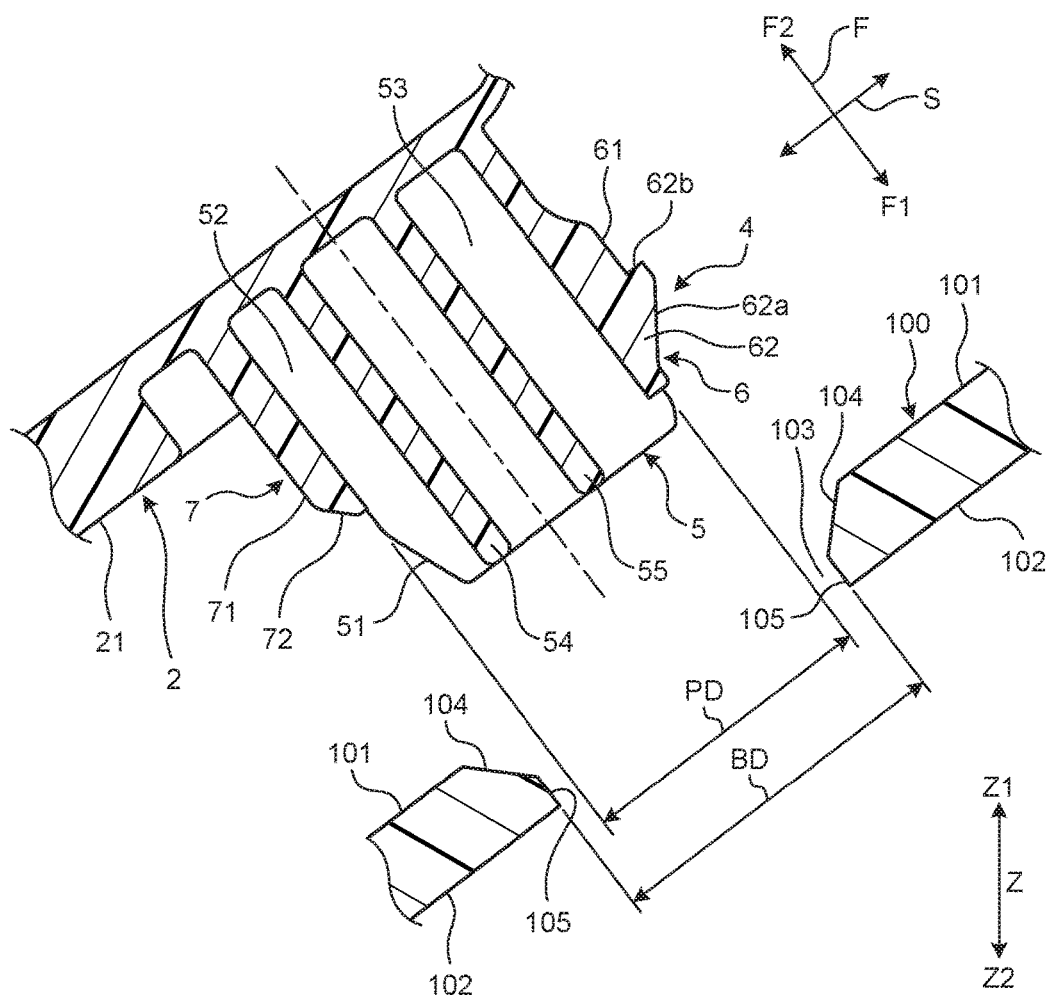
FIG. 3 is a cross-sectional view illustrating a temporary fixing projection and a temporary fixing hole.
Figure 4:
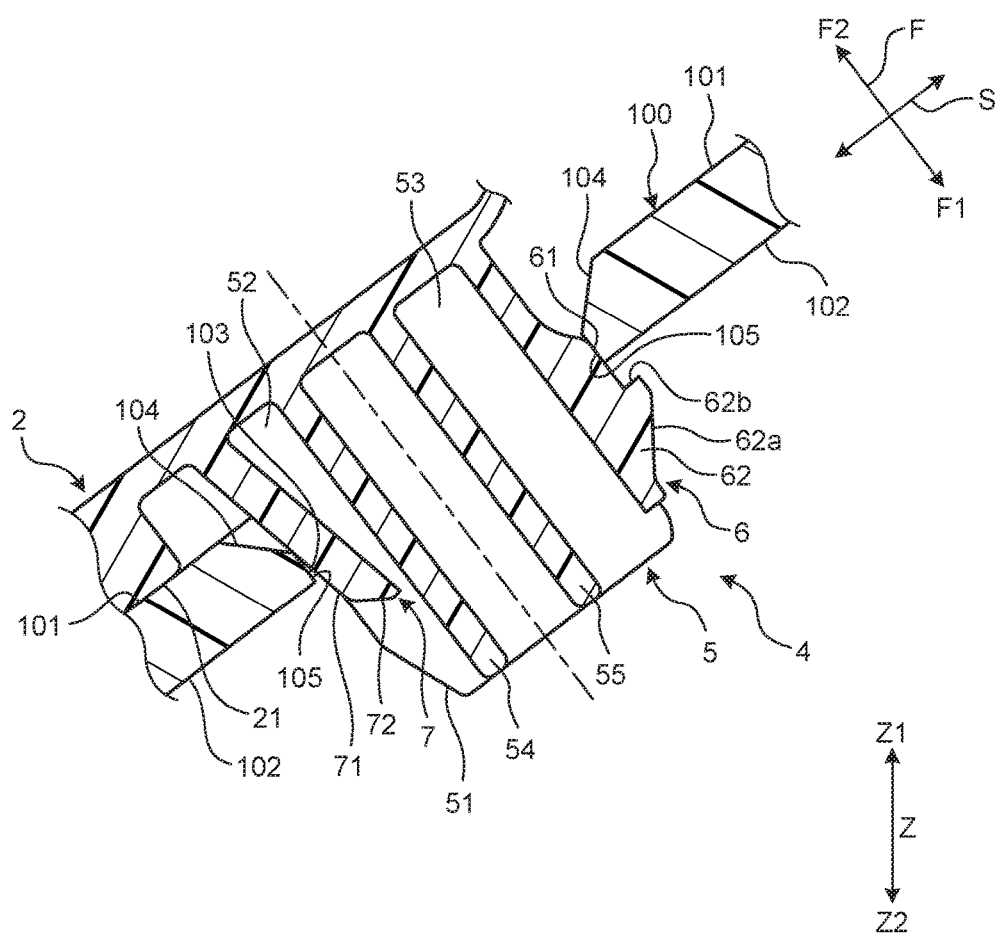
FIG. 4 is another cross-sectional view illustrating the temporary fixing projection and the temporary fixing hole.
Figure 5:
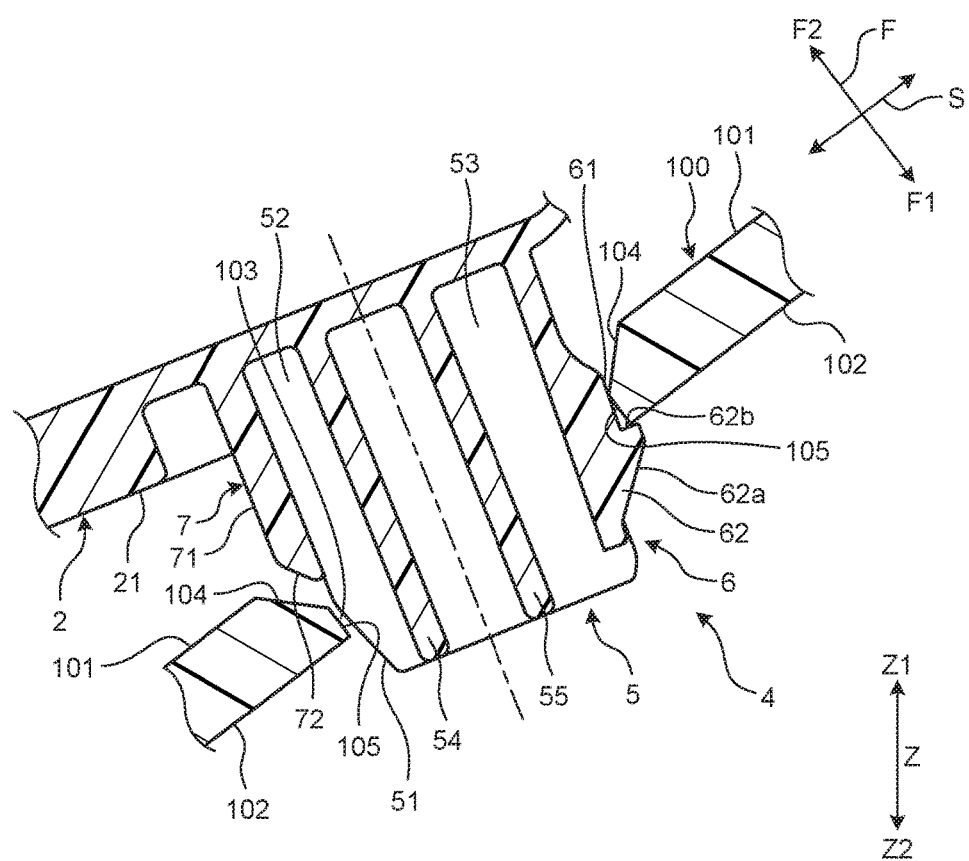
FIG. 5 is still another cross-sectional view illustrating the temporary fixing projection and the temporary fixing hole.

The following describes an electrical connection box according to the embodiment. FIG. 1 is a perspective view illustrating the electrical connection box. FIG. 2 is a partially enlarged view illustrating the electrical connection box. FIG. 3 is a cross-sectional view illustrating a temporary fixing projection and a temporary fixing hole. FIG. 4 is another cross-sectional view illustrating the temporary fixing projection and the temporary fixing hole. FIG. 5 is still another cross-sectional view illustrating the temporary fixing projection and the temporary fixing hole. FIG. 2 is an enlarged view illustrating the temporary fixing projection. FIG. 3 is a sectional view along line A-A of FIG. 2. FIGS. 3 to 5 are explanatory views of temporary fixation of a housing to an attachment panel. The Z direction in each figure is the vertical direction. The Z1 direction is a vertical upper direction while the Z2 direction is a vertical lower direction. The F direction in FIGS. 2 to 5 is an attachment-detachment direction of the electrical connection box with respect to the attachment panel, that is, an insertion-pulling direction of the temporary fixing projection with respect to the temporary fixing hole. The F direction intersects the Z direction. The F1 direction is an attachment direction of the electrical connection box with respect to the attachment panel, that is, an insertion direction of the temporary fixing projection with respect to the temporary fixing hole. The F2 direction is a detachment direction of the electrical connection box with respect to the attachment panel, that is, a pulling out direction of the temporary fixing projection with respect to the temporary fixing hole. The F2 direction is opposite to the F1 direction. The S direction in FIGS. 2 to 5 is perpendicular to the F direction, and is a mutually facing direction in which a locking portion and a plate spring portion face each other.

As illustrated in FIG. 1, an electrical connection box 1 is disposed in a space such as an engine room in a vehicle, for example. The electrical connection box 1 collectively houses therein various electronic components, which are not illustrated, including connection processing parts such as wire harnesses and electrical components such as fuses, relays, and electronic control units. The electrical connection box 1 is sometimes called a junction box, a fuse box, or a relay box, for example. In the embodiment, those boxes are collectively called the electrical connection box 1. As illustrated in FIGS. 3 to 5, the electrical connection box 1 is attached to an attachment panel 100, which is described later, included in a vehicle body, and fixed to the vehicle body. The attachment panel 100 is a target to which the electrical connection box 1 is attached. The target is also described as a fixation target. The electrical connection box 1 includes a housing 2, firm fixing portions 3, and a temporary fixing projection 4.

As illustrated in FIG. 1, the housing 2, which is included in the electrical connection box 1, is formed of a synthetic resin having insulation property. The housing 2 has a space therein and houses the electronic components in the space. The housing 2 is composed of a plurality of divided housing members, which are assembled to each other by being layered. The housing 2 is fixed to the attachment panel 100 in such a manner that a housing outer circumferential surface 21, which is one of the outer circumferential surfaces of the housing 2, faces a housing placement surface 101 of the attachment panel 100. In the embodiment, the layering direction of the housing members of the housing 2 intersects the vertical direction. The layering direction of the housing members is a direction in which the housing outer circumferential surface 21 and the housing placement surface 101 face each other, for example. The housing 2 has the firm fixing portions 3 and the temporary fixing projection 4 that are formed thereon.

To each firm fixing portion 3, a fastening member such as a bolt is attached. The fastening member fastens the housing 2 and the attachment panel 100 so as to firmly fix the housing 2 to the attachment panel 100. As illustrated in FIG. 1, one or more firm fixing portions 3 are provided to the housing 2. The firm fixing portions 3 in the embodiment are formed in such a manner that two firm fixing portions 3 are located on a vertical upper direction side while the other firm fixing portion 3 is located on a vertical lower direction side in a state where the housing 2 is firmly fixed to the attachment panel 100. Each firm fixing portion 3 projects from the outer circumferential surface of the housing 2 toward the outside of the housing 2, and has at least a portion that is formed in a plate shape and to which the bolt is attached. Each firm fixing portion 3 is provided with a firm fixing hole 31 through which the shaft of the bolt passes. The firm fixing hole 31 is formed on the firm fixing portion 3 such that the firm fixing hole 31 faces a screw hole, which is not illustrated, formed on the housing placement surface 101 and allows the shaft of the bolt to pass through the firm fixing hole 31 to be inserted into the screw hole in firm fixation.

The temporary fixing projection 4 is designed to temporarily fix the housing 2 to the attachment panel 100 before the firm fixation. As illustrated in FIGS. 2 to 5, the temporary fixing projection 4 is inserted into a temporary fixing hole 103, which is described later, provided on the attachment panel 100 in the insertion direction. The insertion direction is directed toward at least the vertical lower direction side. The temporary fixing projection 4 allows the housing 2 to be detached from the attachment panel 100 as a result of being pulled out from the temporary fixing hole 103 in the pulling out direction. The pulling out direction is directed toward at least the vertical upper direction side. As illustrated in FIGS. 1 and 2, the housing 2 is provided with the single temporary fixing projection 4 in the embodiment. The temporary fixing projection 4 is formed in such a manner that the temporary fixing projection 4 projects from the housing outer circumferential surface 21 and extends in the insertion direction. The temporary fixing projection 4 is formed in a circular shape viewed from the insertion-pulling direction. As illustrated in FIG. 1, the temporary fixing projection 4 is formed on the end on the vertical upper direction side of the housing outer circumferential surface 21, in a temporary fixing state where the temporary fixing projection 4 is inserted into the temporary fixing hole 103. The temporary fixing projection 4 is formed integrally with the housing 2. The temporary fixing projection 4 includes a main body 5, a locking portion 6, and a plate spring portion 7.

As illustrated in FIGS. 1 to 5, the main body 5 is formed in such a manner that the main body 5 projects from the housing outer circumferential surface 21 and extends in the insertion direction. The main body 5 is formed in a tubular shape having an internal space. The outer circumferential surface of the main body 5 serves as the outer circumferential surface of the temporary fixing projection 4. As illustrated in FIG. 3, the outer diameter PD of the main body 5 is smaller than the hole diameter BD of the temporary fixing hole 103, which is described later. The main body 5 has a tilted surface 51. The tilted surface 51, which is a part of the outer circumferential surface of the main body 5, is formed from a position corresponding to the end in the insertion direction of the plate spring portion 7 to the end in the insertion direction of the main body 5. The tilted surface 51 is tilted toward the center of the main body 5, that is, toward an inside in a radial direction of the main body 5 as it goes in the insertion direction. The main body 5 has two notches, that is, notches 52 and 53.

The notches 52 and 53 are formed from an end portion on the housing outer circumferential surface 21 side of the main body 5 to the end in the insertion direction of the main body 5 along the insertion-pulling direction. The notches 52 and 53 are formed such that they face each other in the mutually facing direction when viewed from the pulling out direction. The notches 52 and 53 are each formed in a groove shape to have a U-shaped portion from the outer circumferential surface side of the main body 5 toward the center of the main body 5, that is, toward the inside in the radial direction of the main body 5, and the U-shaped portion cuts a part of the outer circumference of the main body 5. The notch 52 is formed such that the notch 52 is located on the vertical lower direction side in the temporary fixing state. The notch 52 has a wall surface 54 located on the bottom of the groove shape. The wall surface 54 is formed such that the wall surface 54 separates the internal space of the main body 5 and an external space of the main body 5. The external space is the space in the U-shaped portion of the notch 52. The notch 53 is formed such that the notch 53 is located on the vertical upper direction side in the temporary fixing state. The notch 53 has a wall surface 55 located on the bottom of the groove shape. The wall surface 55 is formed such that the wall surface 55 separates the internal space of the main body 5 and an external space of the main body 5. The external space is the space in the U-shaped portion on the notch 53.

The locking portion 6 is designed to lock the temporary fixing projection 4 to the attachment panel 100 in the temporary fixing state. As illustrated in FIGS. 2 to 5, the locking portion 6 is formed in such a manner that the locking portion 6 projects from the housing outer circumferential surface 21 and extends in the insertion direction. The locking portion 6 is formed such that the end in the insertion direction of the locking portion 6 is located more on the housing outer circumferential surface 21 side than the end in the insertion direction of the main body 5. The locking portion 6 is formed such that the locking portion 6 serves as a part of the outer shape of the temporary fixing projection 4 when viewed from the pulling out direction. The locking portion 6 is formed such that the locking portion 6 is located on the vertical upper direction side in the temporary fixing projection 4 in the temporary fixing state. A part of the locking portion 6 on the inside in the radial direction is located in the U-shaped portion of the notch 53 when viewed from the pulling out direction. The locking portion 6 is formed such that an outer circumferential surface 61 is located on an outside in the radial direction of the outer circumferential surface of the main body 5 when viewed from the pulling out direction. The outer circumferential surface 61 is formed in an arc shape curved in the same direction as the outer circumferential surface of the main body 5 when viewed from the pulling out direction. The locking portion 6 can be elastically deformed toward the inside in the radial direction by an external force acting on the outer circumferential surface 61 toward the inside in the radial direction. The locking portion 6 is provided with a locking claw 62 at the end portion thereof in the insertion direction.

The locking claw 62 is provided in such a manner that the locking claw 62 extends from the end in the insertion direction of the locking portion 6 toward the housing outer circumferential surface 21 and projects from the outer circumferential surface 61 on the outside in the radial direction. The locking claw 62 has a tilted surface 62a and a locking surface 62b. The tilted surface 62a, which is a part of the surface on the outside in the radial direction of the locking claw 62, is formed from the end in the insertion direction of the locking claw 62 toward the housing outer circumferential surface 21. The tilted surface 62a is tilted toward the outside in the radial direction as it goes in the pulling out direction. The locking surface 62b is formed in such a manner that the locking surface 62b projects from the end on the housing outer circumferential surface 21 side of the tilted surface 62a, that is, from a maximum projecting portion on the outside in the radial direction of the locking claw 62, and extends toward the inside in the radial direction to the outer circumferential surface 61 of the locking portion 6. The locking surface 62b is formed along the mutually facing direction, and faces a facing surface 102 of the attachment panel 100 in the insertion-pulling direction in the temporary fixing state. In the temporary fixing state, the locking surface 62b is capable of being in contact with the facing surface 102 in the insertion direction.

The plate spring portion 7 is designed to lock the temporary fixing projection 4 to the attachment panel 100 in the temporary fixing state. The plate spring portion 7 is formed in such a manner that the plate spring portion 7 projects from the housing outer circumferential surface 21 and extends in the insertion direction. The plate spring portion 7 is formed such that the end in the insertion direction of the plate spring portion 7 is located more on the housing outer circumferential surface 21 side than the ends in the insertion direction of the main body 5 and the locking portion 6. The plate spring portion 7 is formed such that the plate spring portion 7 serves as a part of the outer shape of the temporary fixing projection 4 when viewed from the pulling out direction. The plate spring portion 7 is formed such that the plate spring portion 7 is located on the vertical lower direction side in the temporary fixing projection 4 in the temporary fixing state. A part of the plate spring portion 7 in the inside in the radial direction is located in the U-shaped portion of the notch 52 when viewed from the pulling out direction. The plate spring portion 7 has a flat surface 71 formed on the outer circumferential surface thereof, which is located on the outside in the radial direction. The flat surface 71 is formed in such a manner that the flat surface 71 extends in the insertion direction, and is provided with no projection on the outside in the radial direction. The flat surface 71 is formed in an arc shape curved in the same direction as the outer circumferential surface of the main body 5 when viewed from the pulling out direction. The plate spring portion 7 is formed such that the flat surface 71 is located on the outside in the radial direction of the outer circumferential surface of the main body 5 when viewed from the pulling out direction. As a result, the plate spring portion 7 and the locking portion 6 are arranged on the housing outer circumferential surface 21 such that a distance between the flat surface 71 and the outer circumferential surface 61 in the mutually facing direction is larger than the outer diameter PD of the main body 5. Furthermore, the plate spring portion 7 and the locking portion 6 are arranged on the housing outer circumferential surface 21 such that a distance between the flat surface 71 and the outer circumferential surface 61 in the mutually facing direction is larger than the hole diameter BD of the temporary fixing hole 103. The plate spring portion 7 has a tilted surface 72. The tilted surface 72, which is a part of the surface of the plate spring portion 7 at the end portion in the insertion direction, is formed from the inside to the outside in the radial direction. The tilted surface 72 is tilted toward the outside in the radial direction as it goes in the pulling out direction. The tilted surface 72 causes the plate spring portion 7 to be easily inserted into the temporary fixing hole 103 and easily pulled out from the temporary fixing hole 103 using its tilted surface. The plate spring portion 7 can be elastically deformed toward the inside in the radial direction by an external force acting on the flat surface 71 toward the inside in the radial direction. A sectional area of the plate spring portion 7 in the mutually facing direction is set on the basis of an amount of displacement of the plate spring portion 7 when being elastically deformed. In addition, the sectional area of the plate spring portion 7 in the mutually facing direction is set by taking into account the following case. Even when the own weight of the electrical connection box 1 is applied to the plate spring portion 7 in the temporary fixing state and thus the plate spring portion 7 is elastically deformed by a force including the own weight of the electrical connection box 1, the setting prevents the plate spring portion 7 from being elastically deformed to reach a state where the main body 5 is in contact with a contact surface 105 of the attachment panel 100 and receives the weight of the electrical connection box 1.

The attachment panel 100 serves as the fixation target of the electrical connection box 1. The housing 2 is, thus, attached to the attachment panel 100. For example, when the electrical connection box 1 is disposed in the engine room, the attachment panel 100 is a vehicle inner wall forming the engine room. The attachment panel 100 is a member made of a metal such as aluminum, for example. The attachment panel 100 has the housing placement surface 101, on which the housing 2 is placed and which faces the housing outer circumferential surface 21, and the facing surface 102 facing the housing placement surface 101. In the embodiment, the attachment panel 100 is disposed to the vehicle body such that the housing placement surface 101 and the facing surface 102 are perpendicular to the insertion direction. As illustrated in FIGS. 3 to 5, on the housing placement surface 101 of the attachment panel 100, screw holes for firm fixation and the temporary fixing hole 103 are formed. The bolt, which is not illustrated, is inserted into the corresponding screw hole.

The temporary fixing hole 103 is formed in such a manner that the temporary fixing hole 103 passes through from the housing placement surface 101 to the facing surface 102 of the attachment panel 100. The inner circumferential surface of the temporary fixing hole 103 is composed of a tilted surface 104 and the contact surface 105. The tilted surface 104 is tilted from the housing placement surface 101 toward the facing surface 102, that is, tilted toward the inside in the radial direction of the temporary fixing hole 103. The tilted surface 104 causes the temporary fixing projection 4 to be easily inserted into the temporary fixing hole 103 and be easily pulled out from the temporary fixing hole 103 using its tilted surface. The contact surface 105 is formed in such a manner that the contact surface 105 extends in the insertion direction from the end located on the inside in the radial direction of the temporary fixing hole 103 of the tilted surface 104, that is, from the end on the insertion direction side of the tilted surface 104, to the facing surface 102.

The following describes an example of the operator's operation to attach the electrical connection box 1 to the attachment panel 100 and detach the electrical connection box 1 from the attachment panel 100. First, a case is described where the operator attaches the electrical connection box 1 to the attachment panel 100 with reference to FIGS. 3 and 4.

First, the operator temporarily fixes the housing 2 to the attachment panel 100. As illustrated in FIG. 3, in the temporary fixation, the operator causes the housing outer circumferential surface 21 of the housing 2 to face the housing placement surface 101 of the attachment panel 100 in the insertion-pulling direction, and then causes the temporary fixing projection 4 to face the temporary fixing hole 103 in the insertion-pulling direction. The operator continues to move the housing 2 in the insertion direction, that is, continues to move the temporary fixing projection 4 to the temporary fixing hole 103 in the insertion direction. As a result, the operator inserts the end in the insertion direction of the main body 5 of the temporary fixing projection 4 into the temporary fixing hole 103. Then, the operator continues to move the temporary fixing projection 4 in the insertion direction. As a result, the housing outer circumferential surface 21 is in contact with the housing placement surface 101 in the insertion direction. The movement of the temporary fixing projection 4 in the temporary fixing hole 103 in the insertion direction is, thus, hindered.

Specifically, the end in the insertion direction of the main body 5 of the temporary fixing projection 4 is inserted into the temporary fixing hole 103. The locking claw 62 of the locking portion 6 is, then, inserted into the temporary fixing hole 103. Thereafter, the tilted surface 62a of the locking claw 62 of the locking portion 6 is in contact with the contact surface 105. At the time, the tilted surface 51 of the main body 5 is in contact with the contact surface 105. Thereafter, the locking portion 6 is moved in the temporary fixing hole 103 in the insertion direction while the tilted surface 62a is in contact with the contact surface 105.

The tilted surface 62a is tilted toward the outside in the radial direction as it goes in the pulling out direction. The distance between the main body 5 and the tilted surface 62a in the mutually facing direction is, thus, increased as the tilted surface 62a moves toward the outside in the radial direction. The main body 5, not elastically deformed, is called a rigid body. As the locking portion 6 is moved in the temporary fixing hole 103 in the insertion direction, the tilted surface 62a receives, from the contact surface 105, an external force toward the inside in the radial direction. The locking portion 6 is, thus, elastically deformed toward the inside in the redial direction as the locking portion 6 is moved in the temporary fixing hole 103 in the insertion direction.

After the contact of the tilted surface 51 with the contact surface 105, the outer circumferential surface of the main body 5 is in contact with the contact surface 105. The plate spring portion 7 is, then, inserted into the temporary fixing hole 103 from the end thereof in the insertion direction. The flat surface 71 is, then, in contact with the contact surface 105. The distance between the flat surface 71 of the plate spring portion 7 and the tilted surface 62a is larger than the hole diameter BD of the temporary fixing hole 103. The flat surface 71 of the plate spring portion 7, thus, receives, from the contact surface 105, an external force toward the inside in the radial direction. As a result, the plate spring portion 7 is elastically deformed toward the inside in the radial direction.

Thereafter, the locking claw 62 of the locking portion 6 passes over the contact surface 105, and then, projects on the facing surface 102 side. The housing outer circumferential surface 21 is, thus, in contact with the housing placement surface 101 in the insertion-pulling direction, as described above. The temporary fixing projection 4 is inserted into the temporary fixing hole 103. The temporary fixing state is completed.

In the temporary fixing state, as illustrated in FIG. 4, the locking surface 62b of the locking claw 62 is capable of being in contact with the facing surface 102 in the insertion direction. The distance between the outer circumferential surface 61 of the locking portion 6 and the flat surface 71 of the plate spring portion 7 in the mutually facing direction is larger than the hole diameter BD of the temporary fixing hole 103. The locking portion 6 and the plate spring portion 7 are, thus, elastically deformed toward the inside in the radical direction. At that time, the housing 2 moves along the mutually facing direction on the vertical lower direction side while causing the plate spring portion 7 to be further elastically deformed toward the inside in the radical direction by the weight of the housing 2 including electronic components, which are not illustrated. As a result, the housing 2 is temporarily fixed to the attachment panel 100 at the position on the vertical lower direction side. The locking portion 6 and the plate spring portion 7 apply, to the contact surface 105, that is, the attachment panel 100, a restoring force toward the outside in the radial direction as a result of their elastic deformations. The temporary fixing projection 4 is, thus, temporarily fixed to the temporary fixing hole 103. As a result, the housing 2 is fixed to the attachment panel 100.

The operator, then, firmly fixes the housing 2 to the attachment panel 100. The operator aligns the firm fixing holes 31 provided on the firm fixing portions 3 of the housing 2 with the respective corresponding screw holes provided on the attachment panel 100. The operator, then, causes the shafts of the bolts to pass through the respective corresponding firm fixing holes 31, and inserts the shafts into the respective corresponding screw holes, which are not illustrated, provided on the attachment panel 100. The operator, then, fastens the bolts to the attachment panel 100 by screw tightening the bolts. Each firm fixing portion 3 is sandwiched by the head of the bolt and the attachment panel 100. The housing 2 is, thus, firmly fixed to the attachment panel 100. The electrical connection box 1 is attached to the attachment panel 100.

The following describes a case where the operator detaches the electrical connection box 1 from the attachment panel 100 with reference to FIGS. 4 and 5. First, the operator releases the housing 2 from the firm fixing state where the housing 2 is firmly fixed to the attachment panel 100. The operator detaches the bolts fixed to the firm fixing portions 3 of the housing 2 to release the housing 2 from the firm fixing state where the housing 2 is firmly fixed to the attachment panel 100.

The operator, then, releases the housing 2 from the temporary fixing state where the housing 2 is temporarily fixed to the attachment panel 100. The operator moves the housing 2 in the pulling out direction while holding the housing 2, for example.

The operator rotates the housing 2 in such a manner that the operator moves the plate spring portion 7 in the pulling out direction using the position where the outer circumferential surface 61 of the locking portion 6 and the contact surface 105 are in contact with each other as a rotation support, in the temporary fixing state. The contact between the plate spring portion 7 and the contact surface 105 is released. The plate spring portion 7 is, thus, pulled out from the temporary fixing hole 103. Then, the tilted surface 51 of the main body 5 is pulled out. The main body 5 is, thus, pulled out from the temporary fixing hole 103. The operator moves the housing 2 on the vertical lower direction side, and thereafter moves the housing 2 in the pulling out direction. As a result, the locking claw 62 moves in the temporary fixing hole 103 in the pulling out direction. Then, the locking claw 62, that is, the locking portion 6 is pulled out from the temporary fixing hole 103. The temporary fixing projection 4 is, thus, pulled out from the temporary fixing hole 103. The operation to release the housing 2 from the temporary fixing state where the housing 2 is temporarily fixed to the attachment panel 100 is completed. The fixation of the housing 2 to the attachment panel 100 is removed. The electrical connection box 1 is detached from the attachment panel 100.

In the electrical connection box 1 in the embodiment, the locking portion 6 and the plate spring portion 7 of the temporary fixing projection 4 provided to the housing 2 are arranged with the main body 5 interposed therebetween in the radical direction, that is, arranged in such a manner that they face each other in the mutually facing direction. In the temporary fixing state where the temporary fixing projection 4 is inserted into the temporary fixing hole 103, the outer circumferential surface 61 and the flat surface 71 are in contact with the contact surface 105 while they are elastically deformed toward the inside in the radial direction. In the contact, the outer circumferential surface 61 and the flat surface 71 apply, to the contact surface 105, a restoring force toward the outside in the radial direction, thereby making it possible to lock the temporary fixing projection 4 to the temporary fixing hole 103. As a result, the electrical connection box 1 can hold the housing 2 to the attachment panel 100 in the temporary fixing state. The flat surface 71 of the plate spring portion 7 is provided with no projection corresponding to the locking claw 62, unlike the locking portion 6, which is provided with the locking claw 62 projecting toward the outside in the radial direction. This structure makes it possible to attach the housing 2 to the attachment panel 100 and detach the housing 2 from the attachment panel 100 more easily than a case where the flat surface 71 is provided with a projection projecting toward the outside in the radial direction and a case where a plurality of locking portions 6 are formed instead of the plate spring portion 7.

Tolerances in dimensions of the temporary fixing projection 4 and the temporary fixing hole 103 increase in some cases due to the characteristics of the respective members included in the electrical connection box 1 and the attachment panel 100. In the electrical connection box 1 in the embodiment, the temporary fixing projection 4 is inserted into the temporary fixing hole 103 while the outer circumferential surface 61 and the flat surface 71 are in contact with the contact surface 105 in a state where the outer circumferential surface 61 and the flat surface 71 are elastically deformed toward the inside in the radial direction as a result of the plate spring portion 7 and the locking portion 6 being elastically deformed toward the inside in the radial direction. This structure of the electrical connection box 1 absorbs the respective tolerances in dimensions of the temporary fixing projection 4 and the temporary fixing hole 103, and allows the temporary fixing projection 4 to be inserted into the temporary fixing hole 103 to be temporarily fixed. For example, the size of the attachment panel 100, that is, the size of the hole diameter BD of the temporary fixing hole 103 differs in each of the various vehicle bodies due to the space limitations in the vehicle bodies in some cases. Even in such cases, the temporary fixing projection 4 can be fixed to each temporary fixing hole 103 as a result of the plate spring portion 7 and the locking portion 6 being elastically deformed by arranging the plate spring portion 7 and the locking portion 6, for each temporary fixing hole 103, such that they face each other in the mutually facing direction so as to cause the flat surface 71 and the outer circumferential surface 61 to be in contact with the contact surface 105 while being elastically deformed toward the inside in the radial direction. The housing 2 of the electrical connection box 1 can be commonly used for the attachment panels 100 having different sizes in the hole diameters BD of the temporary fixing holes 103 in the respective various vehicle bodies.

In the electrical connection box 1 in the embodiment, the plate spring portion 7 of the temporary fixing projection 4 is formed such that the end of the plate spring portion 7 in the insertion direction is located lower than the end of the main body 5 in the insertion direction. Even when the center axes of the temporary fixing projection 4 and the temporary fixing hole 103 are not aligned in the operator's operation to attach the housing 2 to the attachment panel 100, for example, it is prevented that the plate spring portion 7 is in contact with the housing placement surface 101 before the main body 5 is in contact with the housing placement surface 101, and the plate spring portion 7 is inserted, resulting in the plate spring portion 7 being broken due to excess elastic deformation beyond its limit. Thus, workability for assembling the housing 2 to the attachment panel 100 can be improved. The tilted surface 51 is formed from the end of the plate spring portion 7 in the insertion direction to the end of the main body 5 in the insertion direction. The tilted surface 51 is tilted toward the inside in the radial direction as it goes in the insertion direction. When the operator pulls out the temporary fixing projection 4 from the temporary fixing hole 103, it is easy to pull out the temporary fixing projection 4 while the tilted surface 51 is in contact with the contact surface 105 of the attachment panel 100. As a result, the operator's load to pull out the temporary fixing projection 4 from the temporary fixing hole 103 can be reduced.

In the electrical connection box 1 in the embodiment, the locking portion 6 is located on the vertical upper direction side while the plate spring portion 7 is located on the vertical lower direction side in the temporary fixing state. If the plate spring portion 7 is located on the vertical upper direction side, and a force acts on the temporary fixing projection 4 in the pulling out direction in a state where a force due to the own weight of the electrical connection box 1 acts on the housing 2 in the vertical lower direction, the plate spring portion 7 tends to be easily pulled out from the temporary fixing hole 103 because the flat surface 71 is provided with no projection projecting toward the outside in the radial direction. When the plate spring portion 7 is pulled out from the temporary fixing hole 103, the fixation of the temporary fixing projection 4 to the temporary fixing hole 103 is removed. As a result, the housing 2 easily comes off from the attachment panel 100. In the electrical connection box 1 in the embodiment, the locking portion 6 is located on a side in the direction opposite to the direction along which the own weight of the electrical connection box 1 acts. Even when a force in the pulling out direction acts on the temporary fixing projection 4 in a state where a force due to the own weight of the electrical connection box 1 acts on the housing 2 in the vertical lower direction as described above, the locking surface 62b and the facing surface 102 are in contact with each other, and the contact, thus, can prevent the temporary fixing projection 4 from coming off from the temporary fixing hole 103. As a result, it can be prevented that the housing 2 comes off from the attachment panel 100.

The temporary fixing projection 4 of the electric connection box 1 in the embodiment is formed such that the temporary fixing projection 4 is located on the end on the vertical upper direction side of the housing outer circumferential surface 21 in the temporary fixing state. For example, when the housing outer circumferential surface 21 of the housing 2 and the housing placement surface 101 of the attachment panel 100 are in contact with each other at a contact point more on the vertical lower direction side than the temporary fixing projection 4, and the lower end on the vertical lower direction side of the housing outer circumferential surface 21 and the housing placement surface 101 are apart from each other in the insertion-pulling direction, a rotational force acts on the housing 2 in such a direction that the lower end of the housing outer circumferential surface 21 approaches the housing placement surface 101 around the contact point serving as a rotation support. The rotational force acting on the housing 2 causes the temporary fixing projection 4 to receive a force in the pulling out direction with respect to the temporary fixing hole 103 in a state where the locking surface 62b and the facing surface 102 are in contact with each other. The force in the pulling out direction is reduced as the distance from the contact point is increased on the vertical upper direction side. The temporary fixing projection 4 located on the end on the vertical upper direction side of the housing outer circumferential surface 21 can reduce the force in the pulling out direction, thereby making it possible to prevent the temporary fixing projection 4 from being pulled out from the temporary fixing hole 103 in the temporary fixing state.

In the embodiment, the single temporary fixing projection 4 is provided on the housing outer circumferential surface 21. Multiple temporary fixing projections 4 may be provided on the housing outer circumferential surface 21.

In the electrical connection box according to the embodiment, the plate spring portion provided to the temporary fixing projection is elastically deformed toward the inside in the radial direction in the temporary fixing state, resulting in the flat surface being in contact with the fixation target while the flat surface is elastically deformed toward the inside in the radial direction. The flat surface, thus, applies, to the fixation target, a restoring force toward the outside in the radial direction. As a result, the electrical connection box can hold the housing to the fixation target in the temporary fixing state. Unlike the locking portion, the flat surface is provided with no locking claw projecting toward the outside in the radial direction. As a result, the electrical connection box can be easily attached to the fixation target and detached from the fixation target.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
    a housing having a space therein to house one or more electronic components;
    a firm fixing portion that firmly fixes the housing to a fixation target, the firm fixing portion being formed on the housing; and
    a temporary fixing projection that is formed on the housing and projects from a housing outer circumferential surface of the housing, and that temporarily fixes the housing to the fixation target by being inserted into a temporary fixing hole formed on the fixation target, wherein the temporary fixing projection includes:
- a main body that projects from the housing outer circumferential surface and is formed in a tubular shape; and
- a locking portion and a plate spring portion are arranged on the temporary fixing projection such that the locking portion and the plate spring portion face each other in a radial direction with the main body interposed between the locking portion and the plate spring portion, the locking portion and the plate spring portion each projecting from the housing outer circumferential surface, the locking portion has a locking claw capable of being in contact with the fixation target in an insertion direction where the temporary fixing projection is inserted into the temporary fixing hole, such that the housing is temporarily fixed to the fixation target, and the plate spring portion has a flat surface that extends in the insertion direction, and is configured to elastically deform inwards toward the main body by an external force, and the flat surface is configured to contact the fixation target when the housing is temporarily fixed to the fixation target.

2. The electrical connection box according to claim 1, wherein the plate spring portion is formed such that an end of the plate spring portion in the insertion direction is located lower than an end of the main body in the insertion direction, and the main body has a tilted surface that is formed from an end portion of the plate spring portion in the insertion direction to an end portion of the main body in the insertion direction, and is tilted toward a center of the main body.

3. The electrical connection box according to claim 2, wherein the locking portion and the plate spring portion are arranged in such a manner that the locking portion is disposed on a vertical upper direction side in a vertical direction while the plate spring portion is disposed on a vertical lower direction side in the vertical direction when the housing is temporarily fixed to the fixation target.

4. The electrical connection box according to claim 1, wherein the locking portion and the plate spring portion are arranged in such a manner that the locking portion is disposed on a vertical upper direction side in a vertical direction while the plate spring portion is disposed on a vertical lower direction side in the vertical direction when the housing is temporarily fixed to the fixation target.

5. The electrical connection box according to claim 1, wherein the firm fixing portion projects from an out circumferential surface of the housing.

6. The electrical connection box according to claim 1, wherein the flat surface of the plate spring portion is formed on an outer surface of the plate spring portion and in a radial direction of an outer circumferential surface of the main body.

* * * * *